United States Patent [19]

Adachi et al.

[11] Patent Number: 5,517,241

[45] Date of Patent: May 14, 1996

[54] EEPROM MEMORY CARD FOR AN ELECTRONIC STILL CAMERA

[75] Inventors: Kaoru Adachi; Satoru Okamoto, both of Tokyo, Japan

[73] Assignee: Fuji Photo Film Co., Ltd., Kanagawa, Japan

[21] Appl. No.: 139,158

[22] Filed: Oct. 21, 1993

Related U.S. Application Data

[62] Division of Ser. No. 814,835, Dec. 31, 1991, Pat. No. 5,293,236.

[30] Foreign Application Priority Data

Jan. 11, 1991 [JP] Japan ................................. 3-012511
Feb. 22, 1991 [JP] Japan ................................. 3-048585

[51] Int. Cl.[6] ............................................. H04N 5/76
[52] U.S. Cl. ................................. 348/231; 358/335
[58] Field of Search ........................ 348/96, 207, 231, 348/232, 233; 358/335, 906; 395/425; H04N 5/225, 5/76

[56] References Cited

U.S. PATENT DOCUMENTS

| | | | |
|---|---|---|---|
| 4,803,554 | 2/1989 | Pape | 348/207 |
| 5,032,918 | 6/1991 | Ota et al. | 348/207 |
| 5,057,924 | 10/1991 | Yamada et al. | 358/335 |
| 5,060,069 | 10/1991 | Aoki | 348/207 |
| 5,067,029 | 11/1991 | Takahashi | 358/335 |
| 5,077,612 | 12/1991 | Megrgardt et al. | 348/207 |
| 5,150,328 | 9/1992 | Aichelmann, Jr. | 364/DIG. 2 |
| 5,297,148 | 3/1994 | Harari et al. | 371/10.2 |

Primary Examiner—Wendy R. Greening
Assistant Examiner—Tuan V. Ho

[57] ABSTRACT

An electronic still camera using a memory card as a picture recording medium, and a memory card applicable thereto and implemented by an EEPROM (Electrically Erasable Programmable Read Only Memory). A picture signal generated by a CCD array and representative of a picture is routed through an amplifier and an analog-to-digital converter to a signal processing circuit. The picture signal is subjected to interpolation and other similar processing by the signal processing circuit, coded by a compressing circuit, and then written to a buffer memory. These steps proceed on a real time basis. The buffer memory is constituted by a storage device having a reading speed and a writing speed which are different from each other. A memory card controller reads data out of the buffer memory and writes them in the memory card at a low speed matching the memory card.

3 Claims, 5 Drawing Sheets

EEPROM MEMORY CARD FOR AN ELECTRONIC STILL CAMERA

This application is a divisional of application Ser. No. 07/814,835, filed on Dec. 31, 1991, U.S. Pat. No. 5,293,236, the entire contents of which are hereby incorporated by reference.

BACKGROUND OF THE INVENTION

1. Field of the Invention

The present invention relates to an electronic still camera of the type recording picture data in a recording medium implemented as a memory card, and a memory card applicable to such a camera and using an EEPROM (Electrically Erasable Programmable Read Only Memory).

2. Description of the Prior Art

It is a common practice with an electronic still camera to record picture data representative of a picture and generated by a CCD (Charged Coupled Device) array or similar solid-state image pick-up device in a recording medium, e.g., a memory card. Since the amount of data representative of, among others, a picture is great, they are compressed by, for example, orthogonal transform coding and then written to a recording medium.

A memory card for use with the above-described type of electronic still camera has customarily been implemented by an SRAM (Static Random Access Memory) capable of writing and reading data at a high speed. The problem with an SRAM is that it is volatile and, therefore, needs a back-up battery. Moreover, an SRAM capable of recording a great amount of data, e.g., picture data is expensive, increasing the cost of the memory card.

In light of the above, a memory card using an EEPROM is now under investigation. An EEPROM is a semiconductor memory which is inexpensive and nonvolatile and, therefore, does not need a back-up battery. However, since the writing speed available with an EEPROM is lower than the writing speed of an SRAM, an EEPROM limits the speed at which an electronic still camera can operate in a continuous shoot mode.

SUMMARY OF THE INVENTION

It is, therefore, an object of the present invention to provide an electronic still camera which is operable with a memory card using an inexpensive and nonvolatile EEPROM and, moreover, achieves a satisfactory continuous shooting speed, and a memory card applicable thereto.

In accordance with the present invention, an electronic still camera capable of continuously shooting a scene and storing picture data representative of pictures of the scene in a memory card comprises a picture recording device using an EEPROM as the memory card, an image pick-up device for continuously shooting a scene, a signal processing circuit for executing signal processing with picture data fed from the image pick-up device to thereby produce processed picture data, a compressing circuit for coding the processed picture data by compression to thereby produce compressed picture data, a buffer memory for storing the compressed picture data representative of a plurality of serial frames and outputted by the compressing circuit at a high speed, and feeding the compressed picture data to the picture recording device at a low writing speed, and a storage controller for causing the image recording device to record the data fed from the buffer memory frame by frame.

Also, in accordance with the present invention, a memory card using an EEPROM as a storage device comprises a plurality of EEPROMs for storing data, a plurality of storage controllers each being connected to respective one of the plurality of EEPROMs, at plurality of buffer memories each being connected to respective one of the storage controllers, and a main controller connected to the plurality of storage controllers. The main controller divides data time-serially inputted thereto into blocks of predetermined size by time division and transfers the blocks of data to the respective storage controllers. The storage controllers each writes the data fed from the main controller in associated one of the buffer memories at the input speed and then writes the data in associated one of the EEPROMs by reading the data at a writing speed to the EEPROM.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENT

Figure 1:
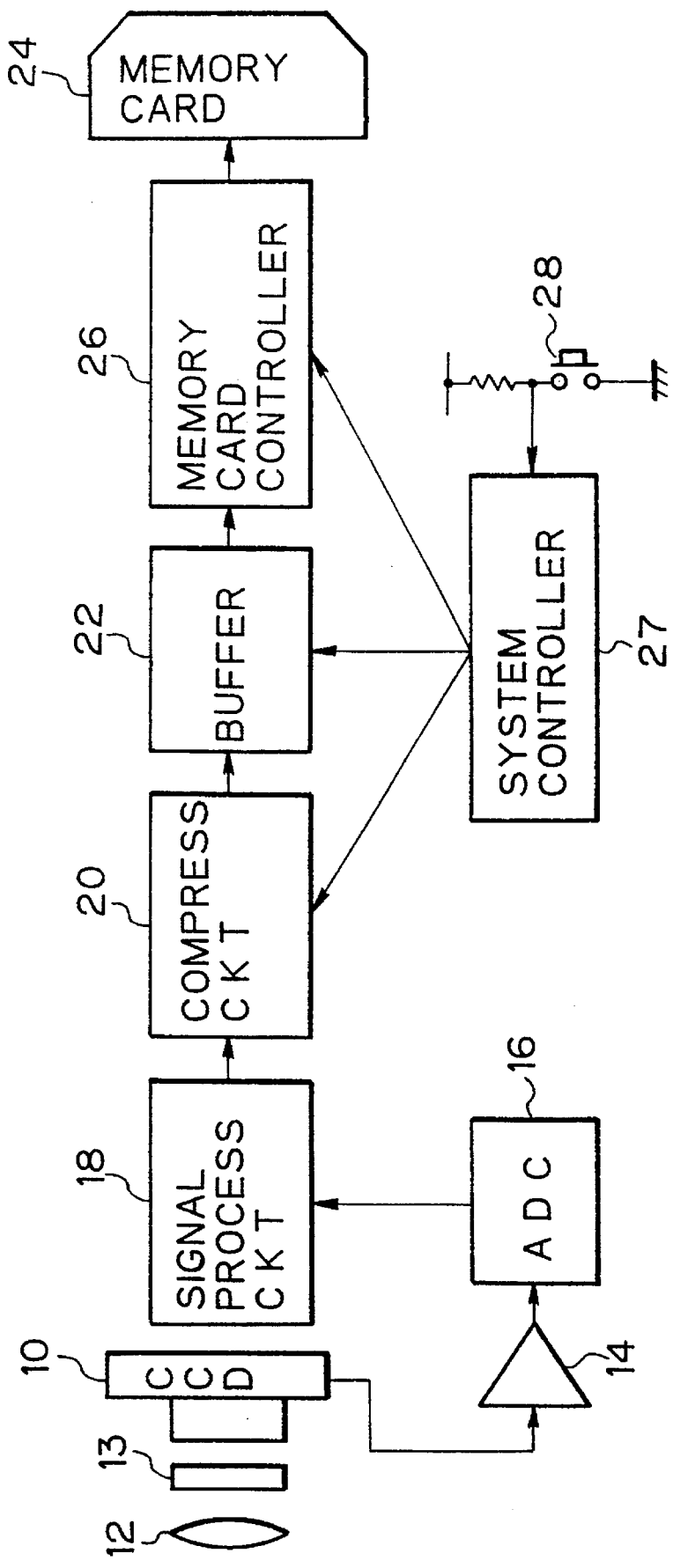
FIG. 1 is block diagram schematically showing an electronic still camera embodying the present invention.

Referring to FIG. 1 of the drawings, an electronic still camera embodying the present invention is shown and has optics made up of a lens 12, a stop 13, and a solid-state image pick-up device 10. Implemented by a CCD array, for example, the image pick-up device 10 picks up one frame or picture by a sequence of steps of storing charges on the imaging surface thereof and transferring and discharging the charges. In a continuous shoot mode, the image pick-up device 10 is capable of shooting several frames per second by repeating such a sequence. The image pick-up device 10 outputs a picture signal in the form color component signals, e.g., red (R), green (G) and blue (B) signals. The color component signals R, G and B, like a TV (television) signal, is generated by raster scanning.

The color component signals R, G and B from CCD array 10 are routed through an amplifier 14 and an analog-to-digital converter (ADC) 16 to a signal processing circuit 18. The amplifier 14 amplifies each of the signals R, G and B to an adequate level. The ADC 16 converts the amplified signals R, G and B to digital data by quantizing each of them to, for example, eight bits. The signal processing circuit 18 executes white balance adjustment, tone adjustment and other conventional preprocessing with the digital data, and then conventional processing for converting the preprocessed digital data to a luminance signal and a chrominance signal. The picture data so processed by the signal processing circuit 18 are applied to a compressing circuit 20.

The compressing circuit 20 codes the input picture data by compression. Specifically, the compressing circuit 20 divides picture data representative of one frame into blocks each having a plurality of pixels and effects orthogonal transform with each of the blocks. For the orthogonal transform, the compressing circuit 20 may use bidimensional discrete cosine transform (DCT). As a result, the picture data are converted to data of frequency domain block by block and sequentially arranged in both of the horizontal and vertical directions of a picture plane in the increasing order with respect to frequency. To code the picture data undergone bidimensional orthogonal transform, the compressing circuit 20 compares the resulting transform coefficients with predetermined threshold values and omits the coefficients which are smaller than the threshold values. Subsequently, the compressing circuit 20 normalizes each of the remaining transform coefficients by dividing it by a particular quantizing step value, i.e., by quantizing or compressing it by a particular normalizing coefficient.

In the illustrative embodiment, the coded picture data from the compressing circuit 20 are temporarily stored in a buffer memory 22. The picture data stored in the buffer memory 22 are recorded in a memory card 24 via a memory card controller 26. The memory card 24 is constituted by an EEPROM which is a nonvolatile semiconductor memory. The buffer memory 22 is implemented as a dual port memory 30, FIG. 2, whose data input and output speeds are not the same. The dual port memory 30 converts high-speed data generated in a continuous shoot mode to low-speed data and has a capacity great enough to temporarily store a plurality of frames of data, e.g., five to ten frames of data in a compressed form. On the other hand, the memory card 24 is capable of storing tens of frames.

The memory card controller 26 controls the operation for writing the picture data read out of the buffer memory 22 in respective frame addresses of the memory card 24. The compressing circuit 20, buffer memory 22 and memory card controller 26 are controlled by a system controller 27. A shutter switch 28 is connected to the system controller 27. On the turn-on of the shutter switch 28, the system controller 27 is turned on to feed power to the buffer memory 22, compressing circuit 20 and memory card controller 26 which consume greater power than the other components of the camera. If desired, the system controller 27 may be so constructed as to shut off the power supply at the moment when all the picture data are read out of the buffer memory 22 for a power saving purpose.

Figure 2:
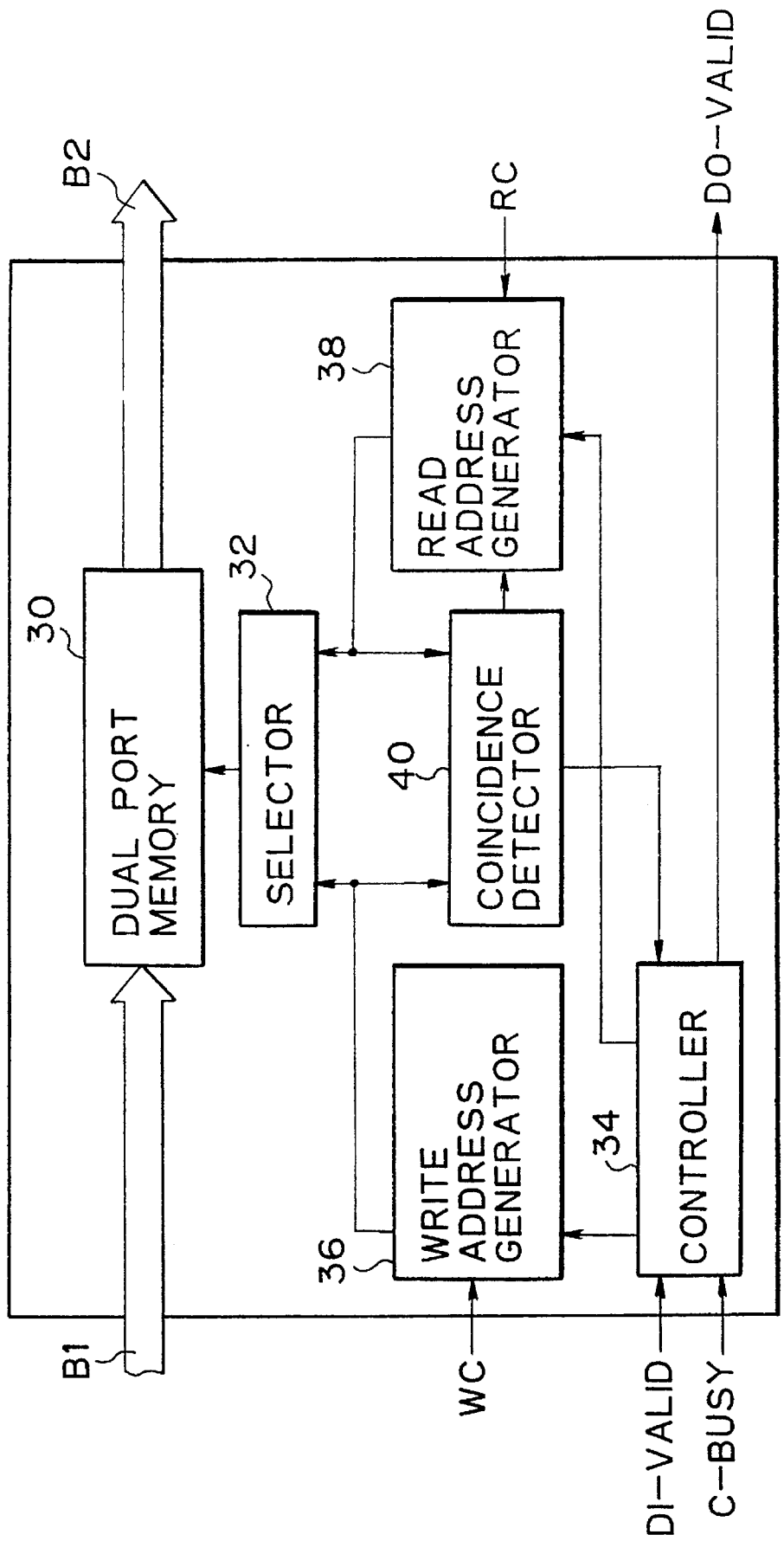
FIG. 2 is a block diagram schematically showing a specific construction of a buffer memory included in the embodiment.

FIG. 2 shows a specific construction of the buffer memory 2. As shown, the output data of the compressing circuit 20 are written to the dual port memory 30 via a bus B1. The data stored in the dual port memory 30 are read out via a bus B2 at a writing speed matching the memory card 24. The write-in and read-out of data from the memory 30 are controlled by components, which will be described hereinafter, via a selector 32.

The system controller 27 sends a signal DI-VALID which is (logical) ONE to a controller 34 when the data outputted by the compressing circuit 20 is valid. On the other hand, the memory card controller 26 sends a signal C-BUSY which is also ONE to the controller 34 when it is not ready to write data in the memory card 24. When the signals DI-VALID and C-BUSY are respectively ONE and (logical) ZERO, the controller 34 feeds to the memory card controller 26 a signal DO-VALID which is ONE and shows that the data read out of the buffer memory 22 is valid. At the same time, the controller 34 delivers an enable signal to each of a write address generator 36 and a read address generator 38.

A clock WC is fed to the write address generator 36 and synchronous with the data being outputted by the coding circuit 20. The write address generator 36 delivers a write address to the dual port memory 30 via the selector 32 in synchronism with the clock WC. Data fed to the dual port memory 30 over the bus B1 is written to a particular address of the memory 30 designated by the write address in synchronism with the clock WC. The memory card controller 26 generates a clock RC when it writes data in the memory card 24. In synchronism with this clock RC, the read address generator 38 feeds a read address to the dual port memory 30. Data is read out of a particular address of the dual port memory 30 designated by the read address in synchronism with the clock RC.

A coincidence detector or address detector 40 receives the output addresses of the write address generator 36 and read address generator 38. When the two output addresses aye identical, the coincidence detector 40 inhibits the read address generator 38 from sending an address so as to eliminate wasteful reading of an empty address.

The operation of the above-described electronic still camera, particularly continuous shoot mode operation, is as follows. When a continuous shoot switch, not shown, and the shutter switch 28 are sequentially pressed in this order, the CCD array 10 is driven to photoelectrically convert the pictures of a scene which are focused onto the imaging surface thereof via the lens 12 one after another. The resulting picture signals from the CCD array 10 are amplified by the amplifier 14, converted to digital data by the ADC 16, and then fed to the signal processing circuit 18. In response, the signal processing circuit 18 executes interpolation and chrominance signal processing frame by frame while sending one block of each frame to the compressing circuit 20 at a time. The compressing circuit 20 compresses each frame of picture data by orthogonal transform coding. The compressed picture data are sequentially written to the buffer memory 22 by a real-time procedure.

When m frames of picture data generated by continuous shooting are written to the buffer memory 22, the memory card controller 26 reads them out at the comparatively low writing speed particular to the memory card 24. The memory card controller 26 writes such picture data in the addresses of the memory card 24 which are assigned on a frame basis. In the illustrative embodiment, when the shutter switch 28 is turned on, the system controller 27 feeds power to the buffer memory 22, compressing circuit 20 and memory card controller 26 which consume the greatest power in the camera. As soon as all the picture data are read out of the buffer memory 22, the system controller 27 shuts off the power supply to the components 22, 20 and 26 to save power.

As stated above, in a continuous shoot mode, the illustrative embodiment sequentially effects, by a real time procedure, signal processing and compression coding with picture signals generated by the image pick-up device 10, while temporarily storing the processed signals in the buffer memory 22 capable of accommoting a plurality of frames. Since the data stored in the buffer memory 22 are transferred to the memory card 24 at a low speed, even an EEPROM whose writing speed is inherently low can be used as the memory card 24. Hence, the embodiment is operable with a memory card using an EEPROM which is inexpensive and does not need a back-up battery. Also, the buffer memory 22 can be implemented by an inexpensive storage device whose capacity is relatively small, since compressed image data are stored therein for a moment. Moreover, the system controller 27 maintains the blocks 20, 22 and 26, FIG. 1, active only from the time when the shutter button 28 is turned on to the time when all the data are read out of the buffer memory 22, thereby minimizing power consumption.

Figure 3:
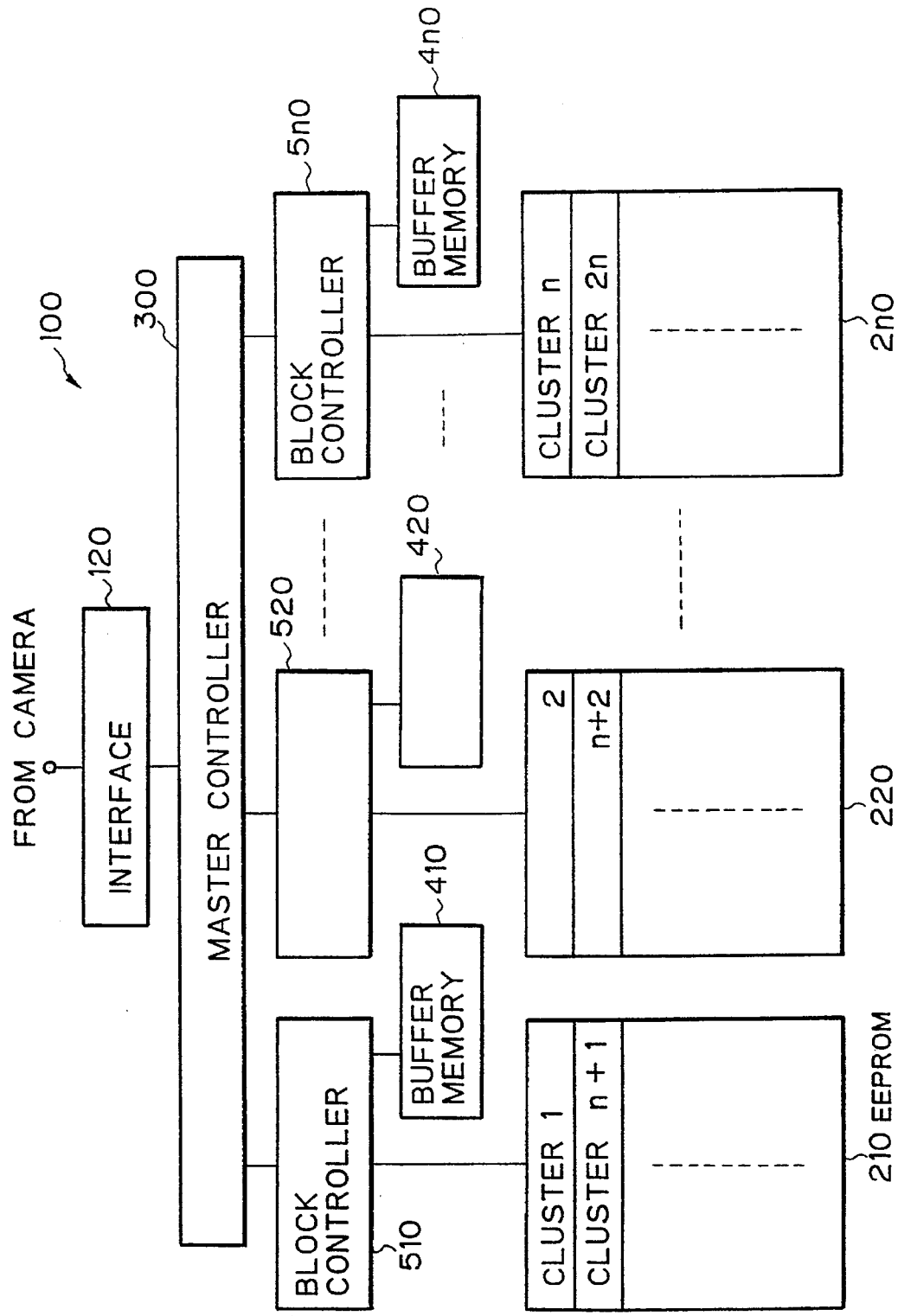
FIG. 3 is a block diagram schematically showing a memory card forming another part of the present invention.
Figure 4:
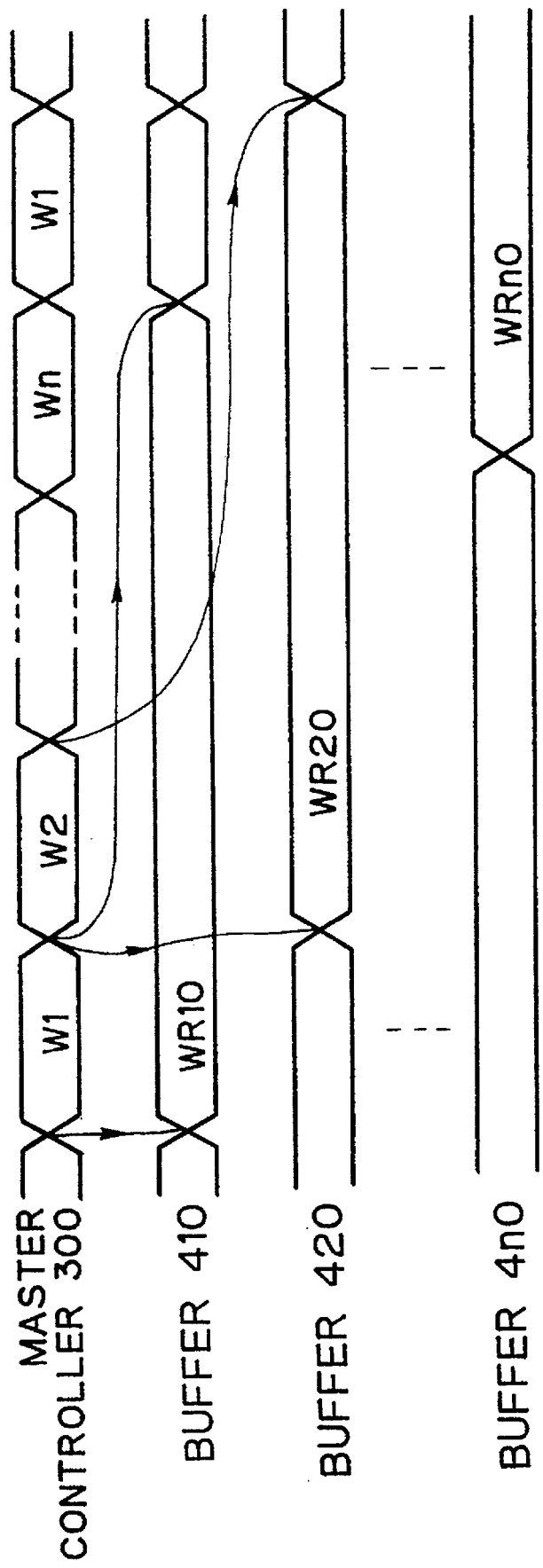
FIG. 4 is a timing chart demonstrating a specific procedure which the memory card of FIG. 3 executes when implemented by a dual port memory.
Figure 5:
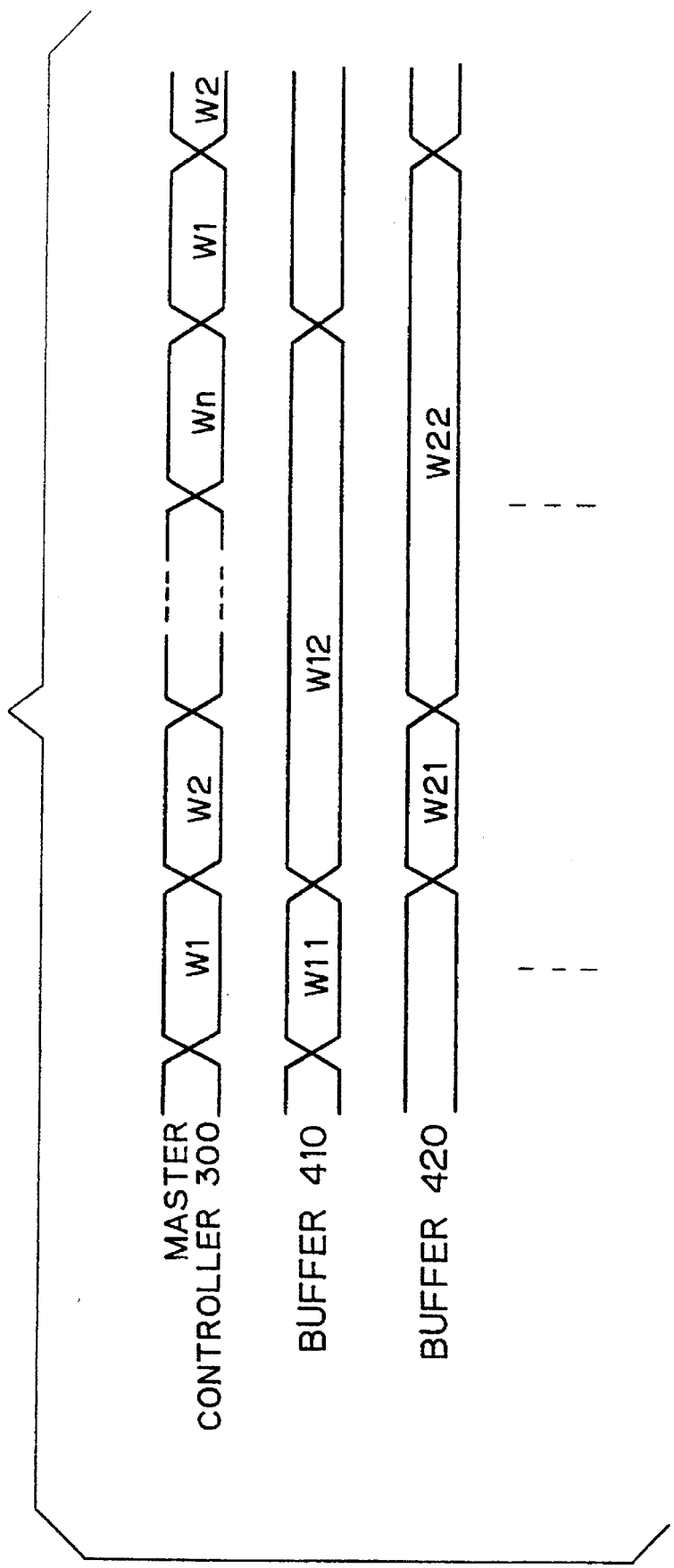
FIG. 5 is a timing chart indicative of a specific procedure occurring when the memory card is implemented by a single port memory.

Referring to FIGS. 3–5, a memory card constituting another part of the present invention will be described. The memory card, generally 100, shown in FIG. 3 is applicable to an electronic still camera, not shown, of the type lacking the buffer memory 22 described above. Even when this type of camera is operated in a continuous shoot mode, the memory card 100 is capable of recording the resulting picture data therein, following the continuous shooting speed of the camera. The memory card 100 records picture data on a frame basis as well as supervisory data associated with the picture data. As shown, the memory card 100 has a plurality of EEPROMs 210, 220, . . . , 2n0 and writes data in them in parallel by a conventional pipeline system, thereby increasing the writing speed available with a memory card using EEPROMs. Block controllers 510, 520, . . . 5n0 are connected to the EEPROMs 210, 220, . . . , 2n0, respectively, and are collectively connected to a master controller 300. Buffer memories 410, 420, . . . , 4n0 each having a relatively small capacity are connected to the block controllers 510, 520, . . . , 5n0, respectively. When the memory card 100 is mounted on the above-mentioned type of camera, the master controller 300 is connected to a control unit built in the camera by an interface 120.

The EEPROMs 210, 220, . . . , 2n0 each has a plurality of unit storage areas, i.e., clusters 1, 2, . . . , n, (n+1), (n+2), . . . , 2n and so forth which will be sequentially selected in this order. Picture data are stored in each of the clusters on, for example, a byte basis and a plurality of bytes at a time, which is the erasable unit of an EEPROM. Preferably, one frame of picture data is written to each cluster. The buffer memories 410–4n0 each has a capacity of several bytes corresponding to the erasable unit of associated one of the EEPROMs 210–2n0, preferably a capacity of one cluster. The buffer memories 410–4n0 are implemented by single port memories or dual port memories capable of writing data at the output speed of the camera and reading them out at the writing speed of the EEPROMs 210–2n0. A single port memory allows data to be read out after data has been read written in while a dual port memory allows data to be written in and read out at the same time.

The EEPROMs 210–2n0 allow data to be written therein after existing data has been erased. Hence, when the memory card 100 is mounted on a camera of the type concerned, the master controller 300 erases one of the EEPROMs designated by the camera a plurality of bytes, preferably one cluster, at a time. As the camera starts on a shooting operation, the master controller 300 repetitively divides time-serial picture data come in from the camera through the interface 120 by time division on the basis of the erasable unit of the EEPROMs and sequentially feeds the divided picture data to the block controllers 510–5n0. The block controllers 510–5n0 write the picture data fed thereto in the buffer memories 410–4n0, respectively. Specifically, the block controllers 510–5n0 write the picture data in the respective buffer memories 410–4n0 at the data transfer speed from the camera and read them out at a low speed matching the EEPROMs 210–2n0 by the FIFO (First-In First-Out) principle. The picture data read out of the buffer memories 410–4n0 are respectively written to the EEPROMs 210–2n0 at the low speed. As a result, a predetermined amount of picture data is written to each of the clusters of the EEPROMs 210–2n0 by time division.

FIG. 4 shows a specific operation of the memory card 100 on the assumption that the buffer memories 410–4n0 are implemented by dual port memories. As shown, in write cycles W1, W2, . . . , Wn for dividing the picture data from the camera into blocks of predetermined amount, the master controller 300 cyclically and sequentially delivers the image data to the block controllers 510–5n0 in this order. The block controllers 510–5n0 transfer the picture data to the respective buffer memories, or dual port memories, 410–4n0. Specifically, the picture data inputted in the write cycle W1 are written to the buffer memory 410 at the input speed and then read thereoutof at the low speed during the write cycles W1-Wn in the same order as when they were inputted. The data read out of the buffer memory 410 are written to the cluster 1 of the EEPROM 210 via the block controller 510 at the low speed. The picture data written to the buffer 420 in the write cycle W2 are read thereoutof during the write cycles W2-W1 and written to the cluster 2 of the EEPROM 210 via the block controller 520. In the same manner, the picture data are sequentially written to the clusters of the other EEPROMs, up to the cluster n of the EEPROM 2n0. Thereafter, the picture delta are sequentially written to the clusters (n+1)–2n by the same procedure.

FIG. 5 demonstrates e specific operation particular to the case wherein the buffer memories 410–4n0 are constituted by single port memories. Again, the master controller 300 delivers the picture data come in from the camera to the block controllers 510–5n0 while dividing them into blocks of. The block controllers 510–5n0 write the picture data in the respective buffers 410–4n0 at the input speed. The procedure for writing and reading data out of the buffer memories 410 -4n0 is different from the procedure described above with reference to FIG. 4, since the memories 410–4n0 are single port memories. Regarding the buffer 410, for example, picture data inputted in the write cycle W1 are written at the input speed and then read thereoutof during the write cycles W2-Wn assigned to the other blocks. Picture data inputted in the write cycle W2 are written to the buffer memory 420 and then read thereoutof during the write cycles W3-W1 assigned to the other blocks. In this manner, the write-in and read-out of picture data occur alternately in the individual buffer memories 410–4n0, whereby the data are recorded in the EEPROMs 210–2n0.

In both the procedures shown in FIGS. 4 and 5, to reproduce a picture, one frame of picture data stored in the EEPROMs are selected, read out in the same order as when they were written in, and then subjected to processing which is opposite to the above-described write processing.

As stated above, the memory card 100 writes data outputted by an electronic still camera at a high speed in a plurality of EEPROMs 210–2n0 in parallel. Therefore, a memory card using low-speed EEPROMs to be used as a high-speed picture recording medium on the basis of a real time procedure. The memory card 100, therefore, is applicable not only to an electronic still camera but also to a computer or similar equipment as a high-speed recording medium.

While the present invention has been described with reference to the particular illustrative embodiment, it is not to be restricted by the embodiment but only by the appended claims. It is to be appreciated that those skilled in the art can change or modify the embodiment without departing from the scope and spirit of the present invention.

What is claimed is:

1. An EEPROM memory card, comprising:

a plurality of EEPROMs for storing data;

a plurality of block controller means each being connected to an associated one of said plurality of EEPROMs;

a plurality of buffer means each connected to an associated one of said plurality of block controller means for storing data for subsequent transfer to the associated EEPROM of said plurality of EEPROMs; and master controller means connected to said plurality of block controller means for dividing data time-serially inputted thereto into a sequence of blocks of predetermined size by time division and transferring a block of said blocks of data one at a time serially to each said respective block controller means for subsequent transfer to the associated buffer means;

said plurality of block controller means thereafter each writing a respective block of said blocks of data fed from said master controller means to the associated buffer means at a relatively high speed and then reading said respective blocks of data out of the associated buffer means in parallel at a relatively low speed to the associated EEPROM of said plurality of EEPROMs.

2. A memory card as claimed in claim 1, wherein said buffer means comprise single port memories whereby data is allowed to be read out only after data has been written into said memories.

3. A memory card as claimed in claim 1, wherein said buffer means comprise dual port memories whereby data is allowed to be written in and read out of said memories at the same time.

* * * * *